United States Patent
Kim et al.

(10) Patent No.: US 7,977,736 B2
(45) Date of Patent: Jul. 12, 2011

(54) VERTICAL CHANNEL TRANSISTORS AND MEMORY DEVICES INCLUDING VERTICAL CHANNEL TRANSISTORS

(75) Inventors: Jin-Young Kim, Dobong-gu (KR); Ki-Whan Song, Gangnam-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/801,915

(22) Filed: Feb. 8, 2007

(65) Prior Publication Data

US 2007/0252196 A1 Nov. 1, 2007

(51) Int. Cl.
*H01L 29/66* (2006.01)
(52) U.S. Cl. .. 257/329; 257/328; 257/392; 257/E27.096
(58) Field of Classification Search ............ 257/329, 257/392, 402, 407
See application file for complete search history.

(56) References Cited

U.S. PATENT DOCUMENTS

| | | | | |
|---|---|---|---|---|
| 4,788,457 A | * | 11/1988 | Mashiko et al. | 326/108 |
| 5,202,855 A | * | 4/1993 | Morton | 365/226 |
| 5,323,351 A | * | 6/1994 | Challa | 365/218 |
| 5,864,158 A | | 1/1999 | Liu et al. | |
| 5,872,374 A | * | 2/1999 | Tang et al. | 257/328 |
| 5,895,957 A | * | 4/1999 | Reedy et al. | 257/352 |
| 6,025,621 A | | 2/2000 | Lee et al. | 257/296 |
| 6,198,671 B1 | * | 3/2001 | Aoyama et al. | 365/189.09 |
| 6,424,016 B1 | * | 7/2002 | Houston | 257/407 |
| 6,531,727 B2 | | 3/2003 | Forbes et al. | |
| 6,538,945 B2 | | 3/2003 | Takemura et al. | |
| 6,549,476 B2 | * | 4/2003 | Pinney | 365/190 |
| 6,734,510 B2 | | 5/2004 | Forbes et al. | |
| 6,861,692 B2 | | 3/2005 | Kujirai et al. | |
| 2002/0036940 A1 | | 3/2002 | Uchikoba et al. | |
| 2005/0017240 A1 | * | 1/2005 | Fazan | 257/59 |

FOREIGN PATENT DOCUMENTS

| | | |
|---|---|---|
| CN | 1383153 A | 12/2002 |
| KR | 1020030000962 A | 1/2003 |
| KR | 1020040043044 | 5/2004 |
| KR | 1020040075566 | 8/2004 |
| KR | 1020050094576 | 9/2005 |

OTHER PUBLICATIONS

Jian Chen et al., "The Enhancement of Gate-Induced-Drain Leakage (GIDL) Current in Short-Channel . . . ," IEEE Electron Device Letters, vol. 13, No. 11, Nov. 1992, p. 572-574.
May 28, 2008 Decision of Grant From Korean Patent Application 10-2007-0015470.
Chinese Office Action dated Oct. 24, 2008 with English Translation.
Office Action Dated Feb. 22, 2010 With English Translation.
Office Action date Sep. 18, 2009 corresponding to Chinese Patent Application No. 200710879610.

* cited by examiner

*Primary Examiner* — Lynne A Gurley
*Assistant Examiner* — Jesse Y Miyoshi
(74) *Attorney, Agent, or Firm* — Volentine & Whitt, PLLC

(57) ABSTRACT

A semiconductor device is provided which includes an NMOS vertical channel transistor located on a substrate and including a p+ polysilicon gate electrode surrounding a vertical p-channel region, and a PMOS vertical channel transistor located on the substrate and including an n+ polysilicon gate electrode surrounding a vertical n-channel region. The NMOS and PMOS vertical channel transistors are optionally operable in a CMOS operational mode.

15 Claims, 12 Drawing Sheets

VERTICAL CHANNEL TRANSISTORS AND MEMORY DEVICES INCLUDING VERTICAL CHANNEL TRANSISTORS

BACKGROUND OF THE INVENTION

1. Field of the Invention

The present invention generally relates to semiconductor devices, and more particularly, the present invention relates to vertical channel transistors and semiconductor memory devices which include vertical channel transistors.

2. Description of the Related Art

FIG. 1 is a schematic cross-sectional view of the PMOS and NMOS planar channel transistors of a conventional CMOS device. As illustrated, the NMOS planar channel transistor is generally defined by n+ type source/drain regions 101 and 103 formed in the surface of a p-type substrate 100, and an n+ type poly-silicon gate electrode 104 is located over an p-channel region 102 of the NMOS planar channel transistor. The PMOS planar channel transistor is generally defined by p+ type source/drain regions 111 and 113 formed in the surface of an n-type well 100' of p-type substrate 100. An n+ type poly-silicon gate electrode 114 is located over a n-channel region 112 of the PMOS planar channel transistor.

FIG. 2 is a graph generally illustrating the relationship between threshold voltage Vth and channel region impurity concentration of NMOS and PMOS planar channel transistors. As is well-understood in the art, the threshold voltages (Vth) of the NMOS and PMOS planar channel transistors can be engineered by precisely controlling impurity concentrations in the channel regions 202 and 212 (FIG. 1), respectively. In a general CMOS operation, the threshold voltage Vth of the NMOS transistor is positive, while the threshold voltage Vth of the PMOS transistor is negative. Accordingly, to realize a CMOS device operation, a precise channel implantation process is generally necessary in the NMOS planar transistor to bring the threshold voltage Vth from negative to positive (see FIG. 2).

The PMOS and NMOS transistors of FIG. 1 are referred to here as "planar channel" transistors since the channel regions 202 and 212 extend along the planar (or horizontal) surface region of the substrate 101. More recently, however, in an effort to increase device integration, "vertical channel" transistors have developed in which the channel regions thereof extend vertically relative to the horizontal substrate surface.

FIG. 3A is a schematic cross-sectional view of a conventional device having NMOS and PMOS vertical channel transistors, and FIG. 3B is perspective view of the same. In FIGS. 3A and 3B, like elements are identified by like reference numbers.

Referring to FIGS. 3A and 3B, the NMOS vertical channel transistor includes a p-type vertical channel layer 302 formed on a p-type substrate 300, a first n+ type source/drain layer 301 formed in the surface of the p-type substrate 300 and surrounding the p-type vertical channel layer 302, a second n+ type source/drain layer 303 formed over the p-type vertical channel layer 302. The NMOS vertical channel transistor further includes an n+ type poly-silicon gate electrode 304 which surrounds the p-type vertical channel layer 302. Although not shown, a gate dielectric is interposed between the n+ type poly-silicon gate electrode 304 and the p-type vertical channel layer 302.

The PMOS vertical channel transistor includes a n-type vertical channel layer 312 formed on a n-well 300' into the p-type substrate 300, a first p+ type source/drain layer 311 formed in the surface of the n-well 300' and surrounding the n-type vertical channel layer 312, a second p+ type source/drain layer 313 formed over the n-type vertical channel layer 312. The PMOS vertical channel transistor further includes an n+ type poly-silicon gate electrode 314 which surrounds the n-type vertical channel layer 312. Also, a gate dielectric (not shown) is interposed between the n+ type poly-silicon gate electrode 314 and the n-type vertical channel layer 312.

Typically, the vertical channels 302 and 312 are defined by pillar-like structures having generally circular horizontal cross-sections, and the poly-silicon gate electrodes 304 and 314 are cylindrical and completely surround the respective vertical channels 302 and 312. Also, the first source/drain layers 301 and 311 and the second type source/drain layers 303 and 313 are typically defined by plate-like structures also having generally circular horizontal cross-sections. In the example of FIGS. 3A and 3B, outer diameters of the poly-silicon gate electrodes 304 and 314 substantially conform to outer diameters of the first source/drain layers 301 and 311, and outer diameters of the vertical channels 302 and 312 substantially conform to outer diameters of the second type source/drain layers 303 and 313.

One drawback of vertical channel transistors is that it is difficult to accurately and reliably implant impurities into the pillar-like structures of the p-type and n-type vertical channel layers 302 and 312. This is especially problematic with respect to the NMOS vertical channel transistor. That is, as explained previously in connection with FIG. 2, it is generally necessary to execute a channel implantation process in order to establish a positive threshold voltage Vth for an NMOS device. However, any attempt to implant ions in the p-type vertical channel 302 will likely result in a non-uniform ion density distribution, which can cause intended variations in the threshold voltage Vth. This problem is amplified as the pillar diameter is of the p-type vertical channel 302 is decreased to enhance device integration.

Accordingly, conventional NMOS vertical channel transistors generally operate at a negative threshold voltage Vth (e.g., −0.4V). It is therefore necessary to configure the corresponding device with a special control block capable of generating a negative voltage to turn off the NMOS vertical channel transistors. In addition, it is difficult to realize a CMOS operational mode using conventional NMOS vertical channel transistors, since a CMOS operational mode generally requires a positive threshold for the NMOS transistors.

SUMMARY OF THE INVENTION

According to an aspect of the present invention, a semiconductor device is provided which includes an NMOS vertical channel transistor located on a substrate and including a p+ poly-silicon gate electrode surrounding a vertical p-channel region, and a PMOS vertical channel transistor located on the substrate and including an n+ poly-silicon gate electrode surrounding a vertical n-channel region.

According to another aspect of the present invention, a semiconductor memory device is provided which includes a substrate including a memory core area and a peripheral circuit area, and an NMOS vertical channel transistor and a PMOS vertical channel transistor located in the memory core area of the substrate. The NMOS vertical channel transistors includes a p+ poly-silicon gate electrode surrounding a vertical p-channel region.

According to yet another aspect of the present invention, a semiconductor memory device is provided which includes a plurality of memory cells connected between a bit line and a respective plurality of word lines, where each of the plurality of memory cells including an NMOS vertical channel select transistor. The semiconductor memory device further includes a sense amplifier connected to the bit line and including a plurality of NMOS vertical channel transistors and a plurality of PMOS vertical channel transistors, where each of the plurality of NMOS vertical channel transistors includes a p+ poly-silicon gate electrode surrounding a vertical p-channel region, and each of the plurality of PMOS vertical channel transistors includes a n+ poly-silicon gate electrode surrounding a vertical n-channel region.

According to still another aspect of the present invention, a semiconductor memory device is provided which includes a memory core operatively coupled to a column decoder and a row decoder on a semiconductor substrate. The memory core includes a plurality of memory cell arrays arranged in rows and columns, a plurality of word line drivers located in columns between respectively adjacent memory cell arrays, and a plurality of sense amplifiers located in rows between respectively adjacent memory cell arrays. Each of the memory cell arrays includes a plurality of NMOS vertical channel select transistors, and each of the word line drivers and sense amplifiers include a plurality of PMOS vertical channel transistors and a plurality of NMOS vertical channel transistors. At least one of the plurality of NMOS vertical channel transistors includes a p+ poly-silicon gate electrode surrounding a vertical p-channel region, and at least one of the plurality of PMOS vertical channel transistors includes a n+ poly-silicon gate electrode surrounding a vertical n-channel region.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF EMBODIMENTS

Figure 1:
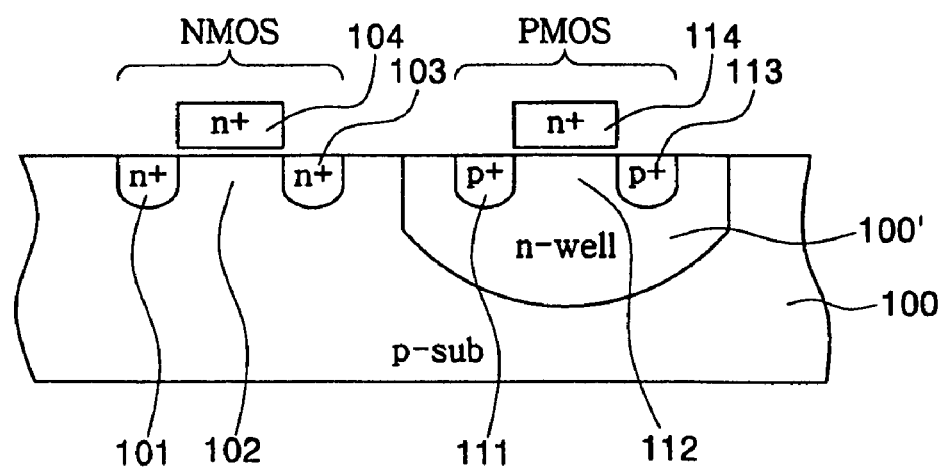
FIG. 1 is cross-sectional view of a conventional planar channel transistor device.
Figure 2:
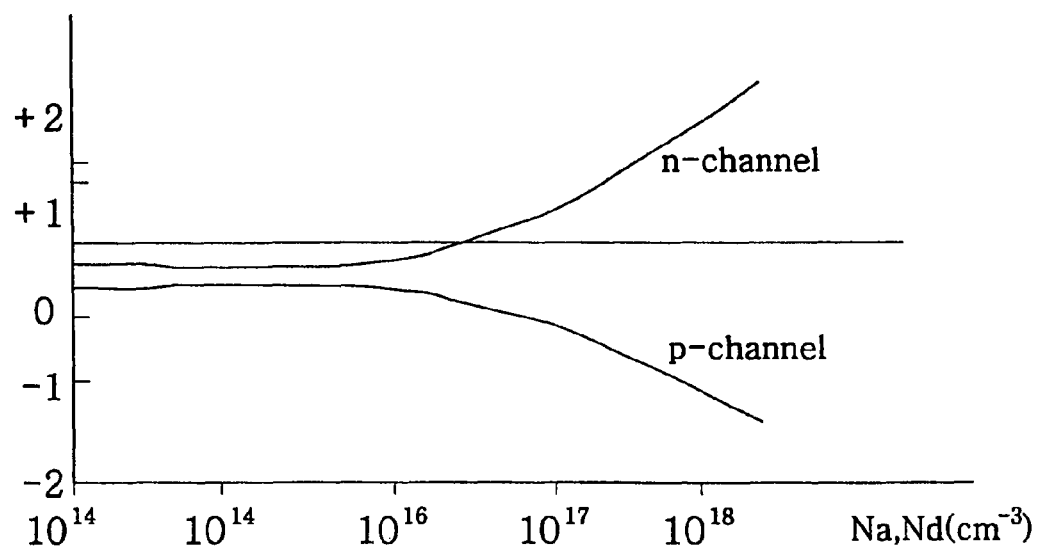
FIG. 2 is a graph showing the relationship between threshold voltage and channel impurity concentration in a conventional planar channel transistor device.

The invention is described more fully hereinafter with reference to the accompanying drawings, in which exemplary embodiments of the present invention are shown. The present invention may, however, be embodied in many different forms and should not be construed as limited to the examples set forth herein. In the drawings, the sizes and relative sizes of layers and regions may be exaggerated and/or simplified for clarity. Also, it will be understood that when an element or layer is referred to as being "on", "connected to" or "coupled to" another element or layer, it can be directly on, connected or coupled to the other element or layer, or intervening elements or layers may be present.

The present invention will now be described by way of preferred, but non-limiting, embodiments of the invention.

Figure 4:
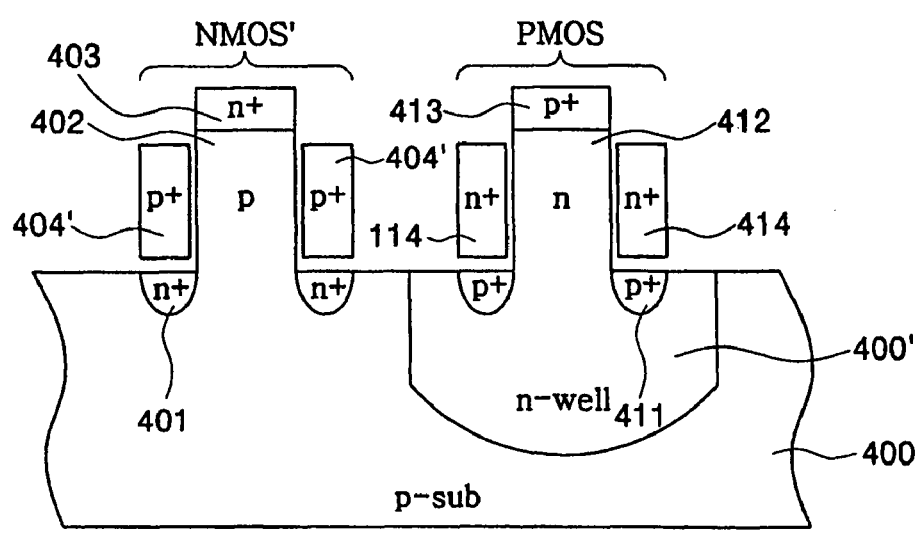
FIG. 4 is a cross-sectional view of a vertical channel transistor device according to an embodiment of the present invention.

FIG. 4 is a cross-sectional schematic view of a semiconductor device according to an embodiment of the present invention. As illustrated, the semiconductor device of this example includes an NMOS vertical channel transistor and a PMOS vertical channel transistor.

Referring to FIG. 4, the NMOS vertical channel transistor includes a p-type vertical channel layer 402 formed on the p-type substrate 400, a first n+ type source/drain layer 401 formed in the surface of the p-type substrate 400 and surrounding the p-type vertical channel layer 402, a second n+ type source/drain layer 403 formed over the p-type vertical channel layer 402. The NMOS vertical channel transistor further includes a p+ type poly-silicon gate electrode 404 which surrounds the p-type vertical channel layer 402. Although not shown, a gate dielectric is interposed between the p+ type poly-silicon gate electrode 404 and the p-type vertical channel layer 402.

The PMOS vertical channel transistor includes a n-type vertical channel layer 412, a first p+ type source/drain layer 411 and a second p+ type source/drain layer 413. The PMOS vertical transistor further includes an n+ type poly-silicon gate electrode 414 which surrounds the n-type vertical channel layer 412. Also, a gate dielectric (not shown) is interposed between the n+ type poly-silicon gate electrode 414 and the n-type vertical channel layer 412.

The vertical channels 402 and 412 may be defined by pillar-like structures having generally circular horizontal cross-sections, and the poly-silicon gate electrodes 404 and 414 may be cylindrical. Also, the first type source/drain layers 401 and 411, and the second type source/drain layers 403 and 413 may be defined by plate-like structures also having generally circular horizontal cross-sections. In the example of FIG. 4, outer diameter of the poly-silicon gate electrodes 404 and 414 substantially conform to outer diameters of the first type source/drain layer 401 and 411, respectively. Likewise, in this example, the outer diameters of the vertical channels 402 and 412 substantially conform to outer diameters of the second type source/drain layers 403 and 413, respectively.

Figure 3A:
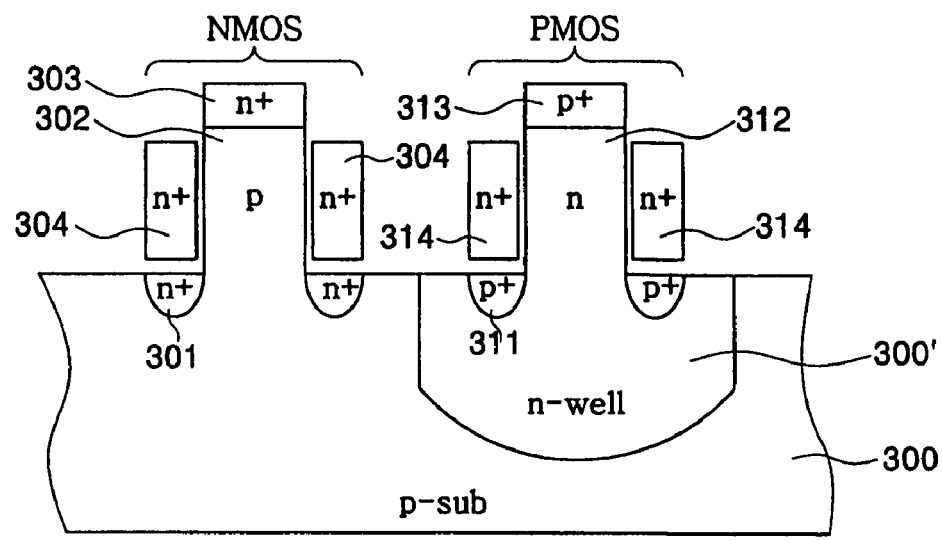
FIG. 3A is a cross-sectional view of a conventional vertical channel transistor device.
Figure 3B:
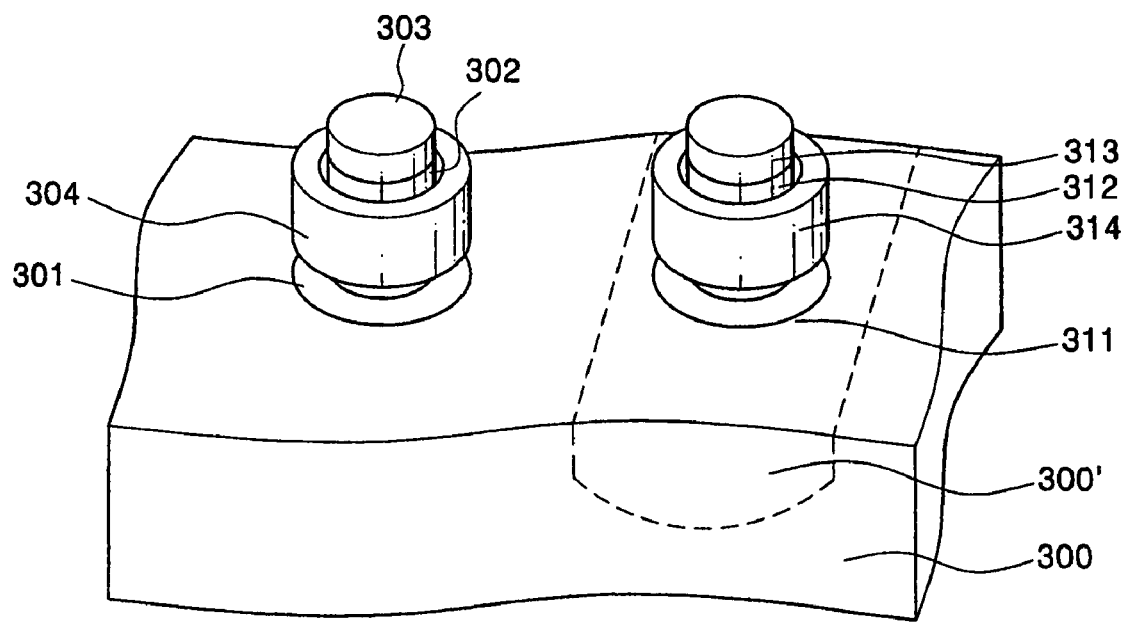
FIG. 3B is a perspective view of a conventional vertical channel transistor device.

The semiconductor device of the embodiment of FIG. 4 differs from the conventional device of previously described FIG. 3 in that the NMOS poly-silicon gate electrode 404 is formed of a p+ type poly-silicon (rather than the conventional n+ type poly-silicon). As explained below, this allows for a positive threshold voltage Vth of the NMOS transistor without the need for channel implantation of the p-type channel 402.

The threshold voltage Vth of a transistor is generally determined in accordance with Equation 1 below:

$$Vth = \Phi_{ms} - (Q_{ox}/C_{ox}) - (Q_d/C_{ox}) + 2\phi_F \qquad (1)$$

where $\Phi_{ms}$ denotes a work function difference between a gate material and a channel body material, $C_{ox}$ denotes a capacitance of a gate oxide material per unit area, $Q_{ox}$ denotes an electrical charge of the gate oxide material, $Q_d$ denotes an electric charge of a semiconductor depletion area, and $\phi_F$ denotes a semiconductor surface potential.

In a conventional device such as that of FIG. 3A, the work function difference $\Phi_{ms}$ between the n+type poly-silicon gate electrode 304 and the p-type channel 302 is negative, and accordingly, this component is responsible for driving down the threshold voltage Vth. For example, $\Phi_{ms}$ may be approximately −0.6V in a conventional vertical channel NMOS transistor device. In contrast, in the vertical channel NMOS device of the example of FIG. 4, the work function difference $\Phi_{ms}$ between the p+ type poly-silicon gate 404 and the p-type channel 402 is positive, and accordingly, this component results in a net increase in the threshold voltage Vth. For example, $\Phi_{ms}$ may be approximately +0.4V in the embodiment of FIG. 4. Accordingly, assuming the aforementioned examples, a +1.0V increase in threshold voltage Vth is realized by the embodiment of the present invention.

For example, if the threshold voltage of the vertical channel transistor of FIG. 3A is about −0.4V, then the threshold voltage of the vertical channel transistor of FIG. 4 may be about +0.6V assuming all other conditions being equal. A positive threshold voltage Vth is thus realized without execution of a difficult channel implantation process.

The existence of a positive threshold voltage of the NMOS vertical channel transistor offers the significant advantage of avoiding the need for a special control block capable of generating a negative voltage to turn off the NMOS vertical channel transistors. This is particularly advantageous in the case where the NMOS and PMOS vertical channel transistors of FIG. 4 are intended to operate in a CMOS operational mode.

Exemplary embodiments of semiconductor memory devices will now be described with reference to cross-sectional schematic views of FIGS. 5A through 5D. It is noted that like elements are represented by like reference numbers throughout these figures.

Figure 5A:
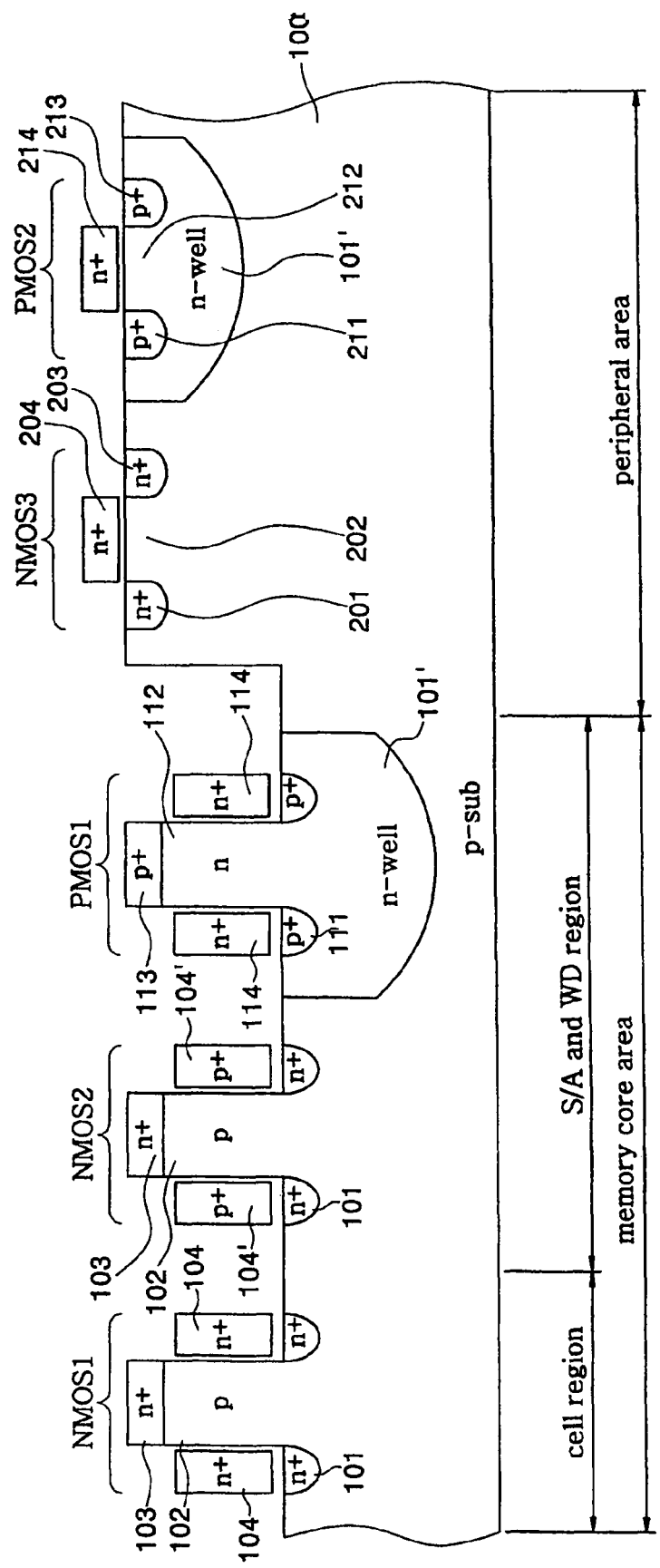
FIGS. 5A, 5B, 5C and 5D are cross-sectional views of memory devices having vertical channel transistors according to respective embodiments of the present invention.

FIG. 5A is a cross-sectional schematic view of a semiconductor memory device according to an embodiment of the present invention. The semiconductor memory device of this example is divided into a memory core area AA and a peripheral circuit area AB. Further, the memory core area AA is divided into a memory cell region AC and a memory cell control circuit region AD. The memory cell control circuit region AD includes, for example, sense amplifier (S/A) circuits and word line driver (WD) circuits (not shown).

Referring to the example of FIG. 5A, the memory cell region AC includes vertical channel select transistors NMOS1 which are similar to the NMOS vertical channel transistor discussed previously in connection with FIG. 3A. That is, the vertical channel select transistor NMOS1 of FIG. 5A includes a p-type vertical channel layer 102, a first n+ type source/drain layer 101 and a second n+ type source/drain layer 103. The vertical channel select transistor NMOS1 further includes an n+ type poly-silicon gate electrode 104 which surrounds the p-type vertical channel layer 102. Although not shown, a gate dielectric is interposed between the n+ type poly-silicon gate electrode 104 and the p-type vertical channel layer 102.

Still referring to FIG. 5A, the memory cell control circuit region AD of this embodiment includes vertical channel transistors NMOS2 and PMOS1 which are similar to those of previously described FIG. 4 and which may optionally function in a CMOS operational mode. That is, the NMOS2 vertical channel transistor includes a p-type vertical channel layer 102, a first n+ type source/drain layer 101 and a second n+ type source/drain layer 103. The NMOS2 vertical transistor further includes a p+ type poly-silicon gate electrode 104' which surrounds the p-type vertical channel layer 102. Although not shown, a gate dielectric is interposed between the p+ type poly-silicon gate electrode 104' and the p-type vertical channel layer 102.

The PMOS1 vertical channel transistor includes a n-type vertical channel layer 112, a first p+ type source/drain layer 111 and a second p+ type source/drain layer 113. The PMOS1 vertical transistor further includes an n+ type poly-silicon gate electrode 114 which surrounds the n-type vertical channel layer 112. Also, a gate dielectric (not shown) is interposed between the n+ type poly-silicon gate electrode 114 and the n-type vertical channel layer 112.

As explained previously in connection with FIG. 4, the vertical channel transistor NMOS2 operates at a positive threshold voltage due to the positive work function difference $\Phi_{ms}$ between the p+ type poly-silicon gate 104' and the p-type channel 102 is positive. As a result, the vertical channel transistors NMOS2 and PMOS1 can advantageously function in a CMOS operational mode.

As also explained above, in the embodiment of FIG. 5A, the vertical channel select transistors NMOS1 of the memory cell region AC are formed of conventional NMOS vertical channel transistor structures. As such, the threshold voltage of the select vertical channel transistors NMOS1 is lower (or negative) when compared to vertical channel transistors NMOS2 utilized in the memory cell control circuit region AD. This has the advantage of reducing stress to gate oxides of the vertical channel select transistors in the memory cell region AC. It will be appreciated that it is generally not necessary to operate select transistors of memory cells in a CMOS mode. Thus, in the embodiment of FIG. 5A, the vertical channel transistors of the memory circuit control region AD may be designed to function in a CMOS operational mode, while the vertical channel select transistors of the memory cell region AC may be designed to minimize stress to the gate oxides thereof.

Still referring to FIG. 5A, the peripheral circuit area AB of this example is configured with planar channel transistor devices NMOS3 and PMOS2. These may be similar to those discussed previously in connection with FIG. 1. That is, the NMOS3 planar channel transistor is generally defined by n+ type source/drain regions 201 and 203 formed in the surface of the p-type substrate 100, and an n+ type poly-silicon gate electrode 204 is located over an p-channel region 202 of the NMOS planar channel transistor. The PMOS2 planar channel transistor is generally defined by p+ type source/drain regions 211 and 213 formed in the surface of an n-type well 101' of the p-type substrate 100. An n+ type poly-silicon gate electrode 214 is located over an n-channel region 212 of the PMOS2 planar channel transistor.

FIG. 5A illustrates an embodiment in which the planar channel transistors of the peripheral circuit area AB reside in a plane which is elevated compared to that of the vertical channel transistors of the memory core area AA. As one skilled in the art will appreciate, this configuration can result from the manner in which the vertical channel transistors are fabricated using trench formation techniques.

Figure 5B:
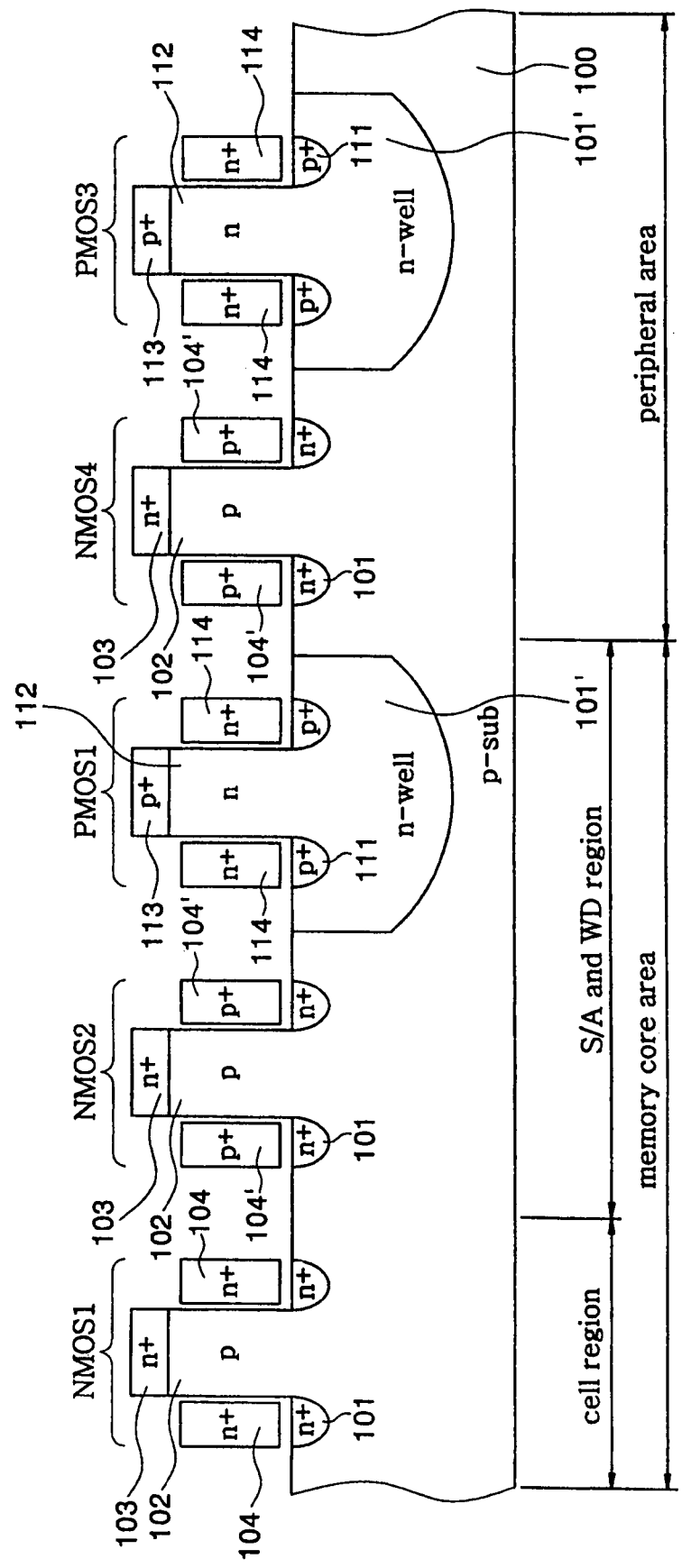

Reference is now made to FIG. 5B which illustrates a semiconductor memory device according to another embodiment of the present invention. The semiconductor memory device of this embodiment is similar to that of FIG. 5A, except that the peripheral circuit area AB is coplanar with the memory core area AA in FIG. 5B, and vertical channel transistors NMOS4 and PMOS3 are adopted in the peripheral circuit region AB of FIG. 5B. Accordingly, to avoid redundancy in the description, only the peripheral circuit region AB of FIG. 5B is described below.

The peripheral circuit area AB of this embodiment includes vertical channel transistors NMOS4 and PMOS3 which are similar to those of previously described FIG. 4 and which may optionally function in a CMOS operational mode. That is, the NMOS4 vertical channel transistor includes a p-type vertical channel layer 102, a first n+ type source/drain layer 101 and a second n+ type source/drain layer 103. The NMOS4 vertical transistor further includes a p+ type poly-silicon gate electrode 104' which surrounds the p-type vertical channel layer 102. Although not shown, a gate dielectric is interposed between the p+ type poly-silicon gate electrode 104' and the p-type vertical channel layer 102.

The PMOS3 vertical channel transistor includes a n-type vertical channel layer 112, a first p+ type source/drain layer 111 and a second p+ type source/drain layer 113. The PMOS3 vertical transistor further includes an n+ type poly-silicon gate electrode 114 which surrounds the n-type vertical channel layer 112. Also, a gate dielectric (not shown) is interposed between the n+ type poly-silicon gate electrode 114 and the n-type vertical channel layer 112.

As explained previously in connection with FIG. 4, the vertical channel transistor NMOS4 operates at a positive threshold voltage due to the positive work function difference $\Phi_{ms}$ between the p+ type poly-silicon gate 104' and the p-type channel 102 is positive. As a result, the vertical channel transistors NMOS4 and PMOS3 can advantageously function in a CMOS operational mode.

Figure 5C:
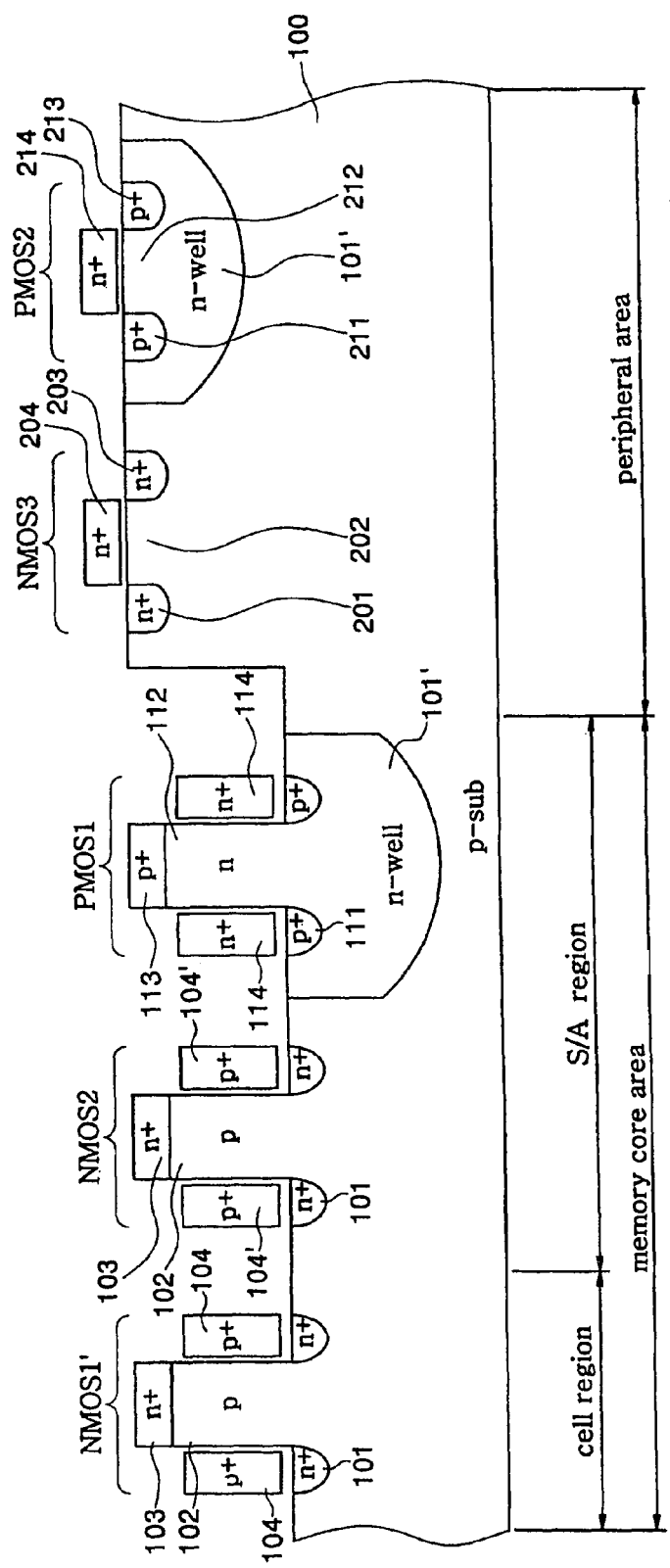

Reference is now made to FIG. 5C which illustrates a semiconductor memory device according to another embodiment of the present invention. The semiconductor memory device of this embodiment is similar to that of FIG. 5A, except that a vertical channel select transistors NMOS1' are adopted in the memory cell region AC of FIG. 5C. Accordingly, to avoid redundancy in the description, only the NMOS1' of the memory cell region AC of FIG. 5C is described below.

The memory cell region AC of this example is configured with vertical channel select transistor NMOS1' that may be similar to the vertical channel transistor NMOS of FIG. 4. That is, the vertical channel select transistor NMOS1' of FIG. 5C includes a p-type vertical channel layer 102, a first n+ type source/drain layer 101 and a second n+ type source/drain layer 103. The NMOS1' vertical channel select transistor further includes a p+ type poly-silicon gate electrode 104' which surrounds the p-type vertical channel layer 102. Although not shown, a gate dielectric is interposed between the p+ type poly-silicon gate electrode 104' and the p-type vertical channel layer 102.

The vertical channel select transistor NMOS1' operates at a positive threshold voltage due to the positive work function difference $\Phi_{ms}$ between the p+ type poly-silicon gate 104', and the p-type channel 102 is positive. As a result, it may not be necessary to configure a special control block capable of generating a negative voltage to turn off the NMOS1' vertical channel select transistors. However, when compared to the embodiment of FIG. 5A, additional stress may be applied to the gate oxides within the memory cell region AC.

Figure 5D:
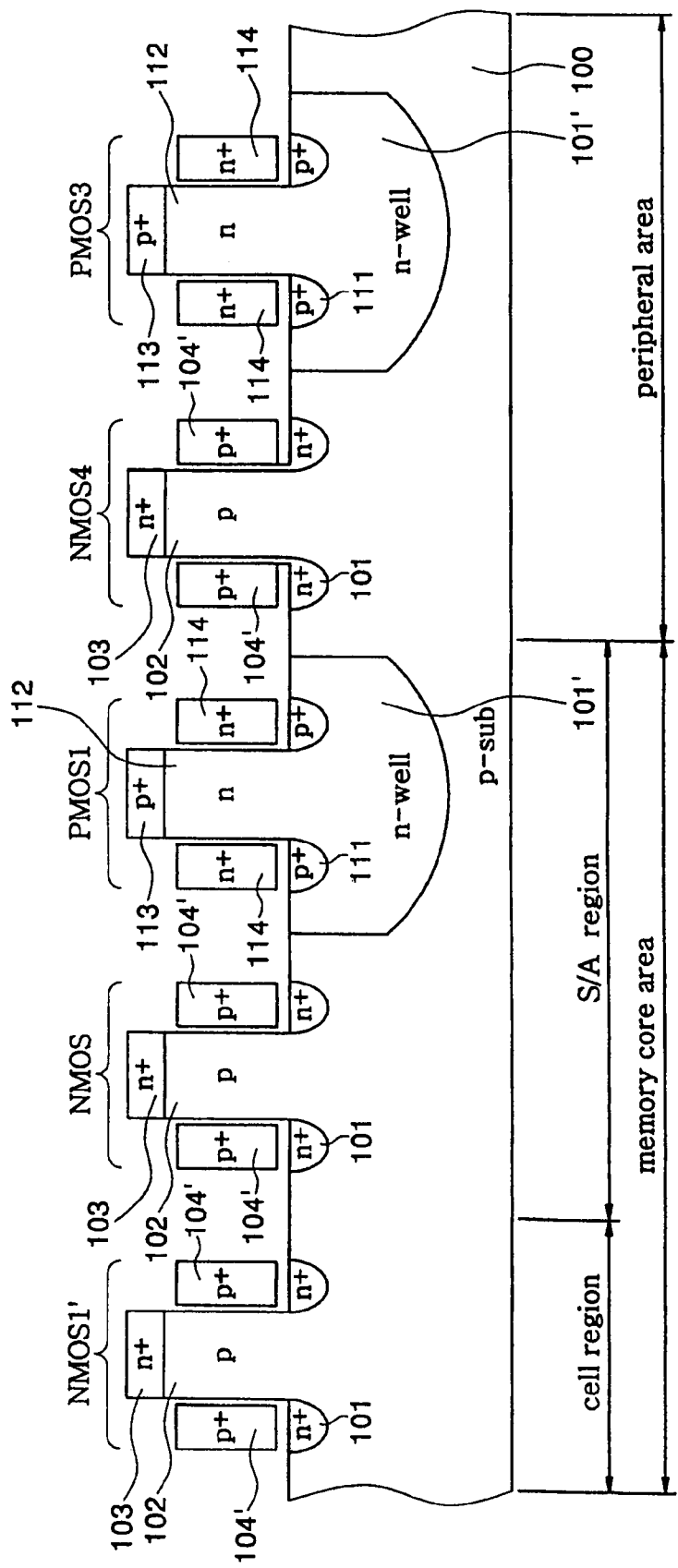

Reference is now made to FIG. 5D which illustrates a semiconductor memory device according to another embodiment of the present invention. The semiconductor memory device of this embodiment is similar to that of previously described FIG. 5B, except that the vertical channel select transistors NMOS1' of previously described FIG. 5C are adopted in the memory cell region AC of FIG. 5D. The example of FIG. 5D is otherwise the same as the example of FIG. 5B, and accordingly, a detailed description of FIG. 5D is omitted here to avoid redundancy.

Figure 6:
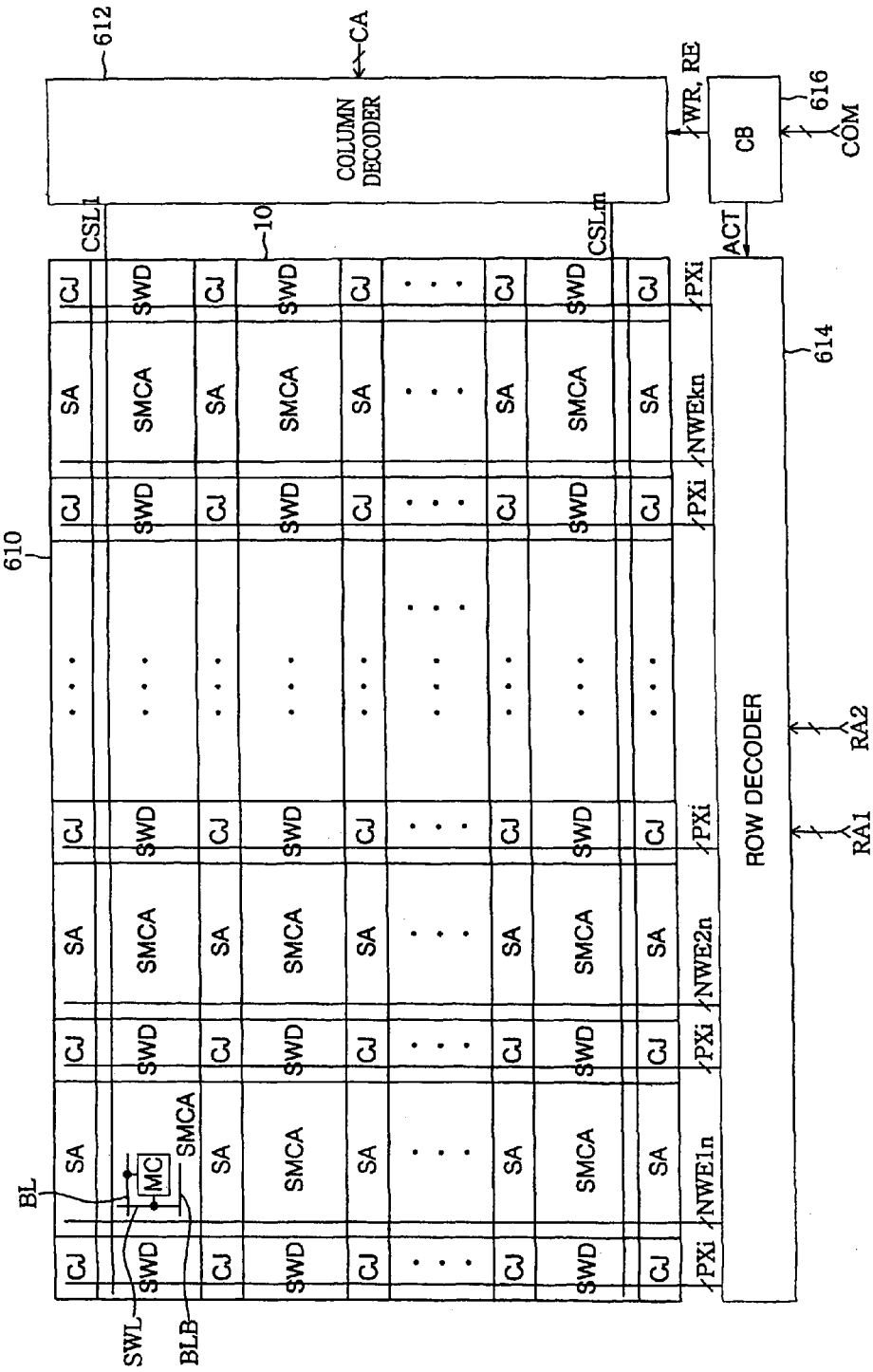
FIG. 6 illustrates a memory device layout having vertical channel transistors according to an embodiment of the present invention.

Reference is now made to FIG. 6 which illustrates the layout architecture of a semiconductor device according to an embodiment of the present invention. As shown, the semiconductor device of FIG. 6 includes a memory core area 10, a column decoder 12, a row decoder 14, and a control block 16.

The memory core area 10 includes a plurality of memory cell regions SMCA arranged in rows and columns. Each memory cell region SMCA includes an array of memory cells MC connected to bit lines BL and BLB and sub-word lines SWL. Although not shown, each memory cell includes a storage element and a NMOS vertical channel select transistor. The NMOS vertical channel select transistors may be configured like the NMOS1 vertical channel transistor of previously described FIG. 5A (having an n+ type poly-silicon gate), or like the NMOS1' vertical channel transistor of previously described FIG. 5C (having an p+ type poly-silicon gate).

The memory core area 10 further includes sense amplifier SA and sub-word line drivers SWD arranged between adjacent memory cell regions SMCA as shown. As one skill in the art will appreciate, the sense amplifiers SA are connected to the bit lines BL and BLB of the memory cell regions SMCA, and the sub-word line drivers SWD are connected to the sub-word lines SWL of the memory cell regions SMCA. The word line drivers PXID are controlled by word line driver control circuits PXID. As illustrated, the word line driver control circuits PXID are located at intersections defined by the rows of sub-word line drivers SWD and the columns of sense amplifiers SA. Reference characters CJ of FIG. 6 denote conjunction regions in which miscellaneous circuitry (such as sense amplifier control circuitry) may be located.

In the example of this embodiment, the word line driver control circuits PXID, the sense amplifiers SA, the sub-word line drivers SWD, and the conjunction regions CJ contain NMOS and/or PMOS vertical channel transistors. The NMOS vertical channel transistors are preferably configured like the NMOS2 vertical channel transistor of previously described FIG. 5A (having a p+ type poly-silicon gate). As such, a CMOS operational mode may be adopted where appropriate.

The row decoder 14 is responsive to an active signal ACT from the control block 16 and row addresses RA1 and RA2 to generate word line control and enable signals PXi and NWE. The column decoder 12 is responsive to write and read control signals WR and RE and column address CA to generate column select signals CSL. The control block 16 is responsive to command signals COM to generate the active signal ACT and the write and read control signals WR and RE. Those skilled in the art are well-acquainted with the functions of the column decoder 12, the row decoder 14 and the control block 16, and accordingly, a more detailed description is omitted here.

The column decoder 16, the row decoder 14 and the control block 16 may contain planar channel and/or vertical channel transistors such as those described previously in connection with the peripheral circuit areas of FIGS. 5A through 5D, and may operate in a non-CMOS operational mode and/or CMOS operational mode.

Figure 7:
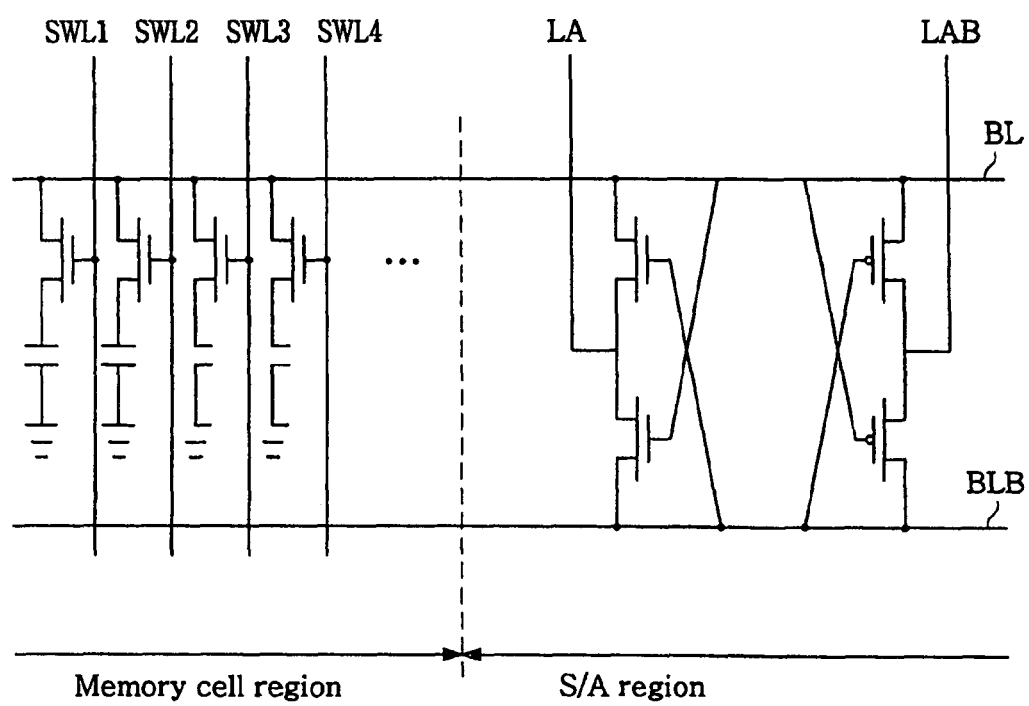
FIGS. 7 and 8 are circuit diagrams of memory cells and sense amplifiers according to embodiments of the present invention.

FIG. 7 is a circuit diagram depicting a memory core area of a semiconductor memory according to an embodiment of the present invention.

Referring to FIG. 7, memory includes a plurality of complementary bit line pairs BL1 and BL1B, BL2 and BL2B, . . . , BLy and BLy, and a plurality of word lines WL1 through WLm. It will be understood that the number of bit line pairs and word lines is not limited in the context of the present invention.

A memory cell region SMCA includes a plurality of memory cells MC, where each memory cell includes a vertical channel transistor N and a capacitive element connected in series between a bit line BL and a reference potential. In particular, complementary memory cell MC pairs are respectively connected to complementary bit lines pairs BL and BLB, and each of the memory cells MC is gated to one of the word lines WL.

Sense amplifier regions SA are located on opposite sides of the memory cell region SMCA. The sense amplifier regions SA include sense amplifier circuits SA1, SA2, . . . , SAy respectively connected between the bit line pairs BL1 and BL1B, BL2 and BL2B, . . . , BLy and BLyB as shown in FIG. 7. In this example, odd-numbered sense amplifier circuits SA connected to odd-numbered bit line pairs BL/BLB are located on one side of the memory cell region SMCA, and even-numbered sense amplifier circuits SA connected to even-number bit line pairs BL/BLB are located on the other side of the memory cell region SMCA.

For example, the sense amplifier circuit SA1 includes first and second precharge circuits PRE1 and PRE2 each composed of n-channel transistors N6-N8 and responsive to precharge voltages VPRE1 and VPRE2; first and second isolation circuits ISO1 and ISO2 each composed n-channel transistors N1 and N2 and responsive to isolation signals IS1 and IS2; a column select gate CSG composed of n-channel transistors N10 and N11 which are connected to complementary data lines D1 and D1B, and responsive to a column select signal CSL; and a sense amplifier PSA/NSA composed of p-channel transistors P1 and P2 and n-channel transistors N8 and N9, and responsive to complementary sense enable lines LA and LAB.

Still referring to FIG. 7, a word line driver regions SWD are located on opposite sides of the memory cell region SMCA, and each include a plurality of word line driver circuits SWD1-SWDn. In FIG. 7, the word line driver circuits SWD1-SWDn located to the left (in the drawing) of the memory cell region SMCA each includes first and second word drivers SD1 and SD2 for driving odd-number word lines WL, and the word line driver circuits SWD1-SWDn located to the right (in the drawing) of the memory cell region SMCA each includes first and second word drivers SD1 and SD2 for driving even-number word lines WL. Further, the word line driver circuits SWD1-SWDn are enabled by word line enable signals NWE1-NWEj as illustrated in FIG. 7.

FIG. 7 further illustrates conjunction regions CJ which contain control circuitry D that is responsive to control signals PX1-PX2 generated by a row decoder to control the operation of the word line driver circuits SWD1-SWDn.

The operation of the various circuit elements illustrated in FIG. 7 are well-understood by those skilled in the art, and accordingly, a detail description thereof is omitted here for brevity.

It can be seen that the memory core layout of FIG. 7 is similar to that of previously described FIG. 6.

Figure 8:
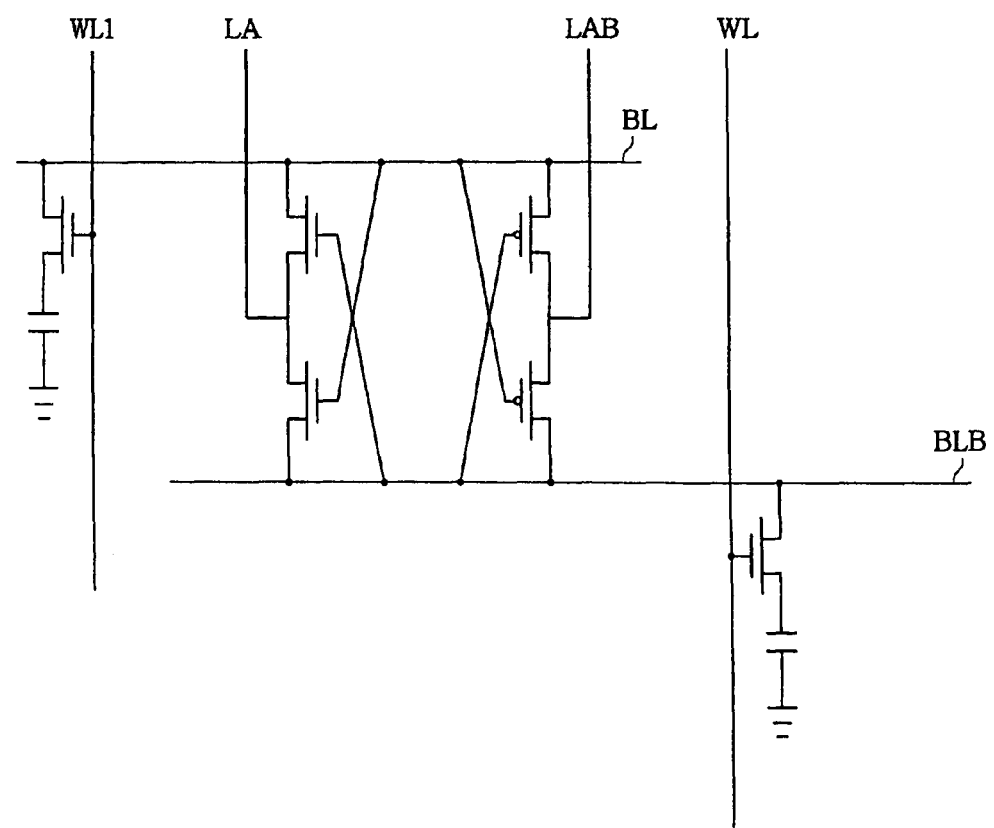

The layout of FIG. 7 is generally known in the art as a folded-bit line architecture. FIG. 8 depicts a memory core area of a semiconductor memory according to another embodiment of the present invention in which a so-called op en-bit line architecture is adopted. In the case, the complementary memory cell MC pairs are contained in separate memory cell regions SMCA located on opposite sides of the sense amplifier region SA. Bit lines BL1 through BLy are connected to the memory cells MC of one of the memory cell regions SMCA, and complementary bit lines BLB through BLyB are connected to the complementary memory cells MC of the other memory cell region SMCA.

The various circuit elements illustrated in FIG. 8 are identified by the same reference numbers illustrated in previously described FIG. 7, and the operation of the circuit elements illustrated in FIG. 8 is well-understood by those skilled in the art. Accordingly, a detail description thereof is omitted here for brevity.

Figure 9:
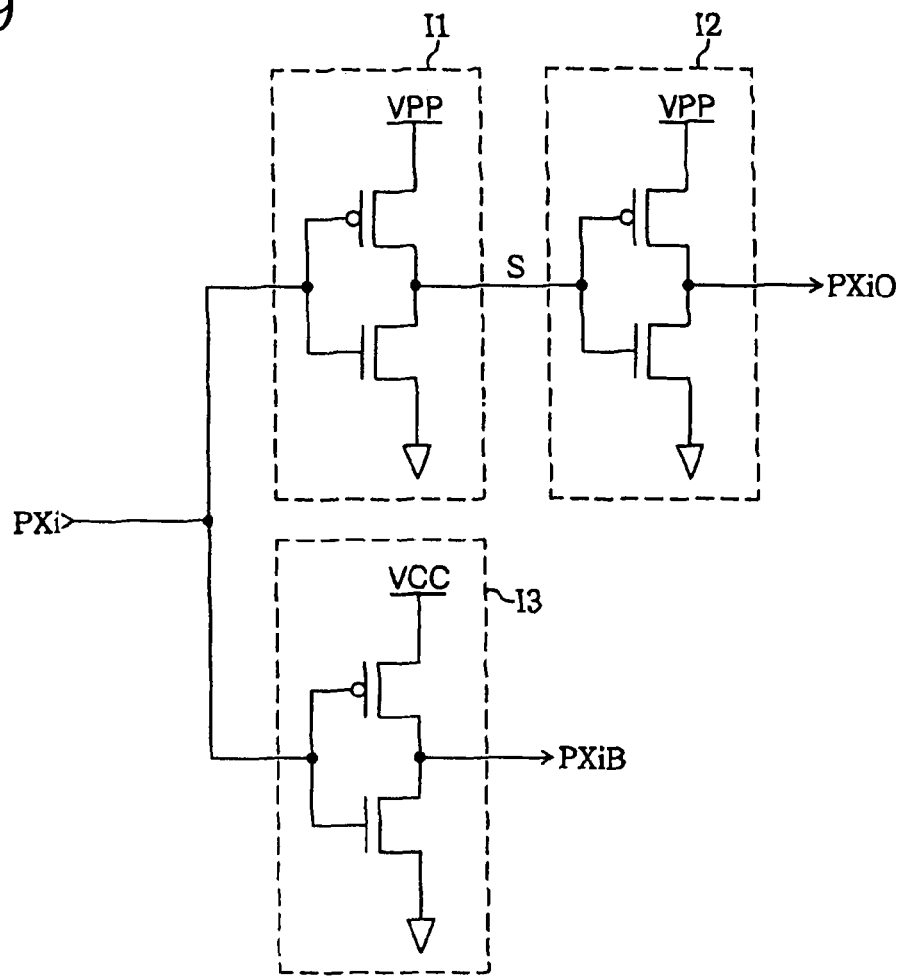
FIG. 9 is a circuit diagram of a word line driver control circuit according to an embodiment of the present invention.

FIG. 9 is a circuit diagram of word line driver control circuit PXID illustrated in FIG. 6 according to an embodiment of the present invention. As shown, the word line driver control circuit PXID includes inverters 11, 12 and 13. The inverters 11 and 12 are driven by a boosted voltage VPP and function to delay the control signal PXi generated by the row decoder (FIG. 6) and output a delayed control signal PXiO. The inverter 13 is driven by a supply voltage VCC and functions to invert the control signal PXi and output an inverted control signal PXiB.

In the embodiment of FIG. 9, each of the inverters 11, 12 and 13 is configured of series connected and commonly gated NMOS (N12, N13 and N14) and PMOS (P3, P4 and P5) vertical channel transistors which may be structured like the NMOS2 and PMOS 1 vertical channel transistors illustrated in FIG. 5A. As such, the NMOS vertical channel transistors (having a p+ type poly-silicon gate) have a positive threshold voltage Vth.

Figure 10:
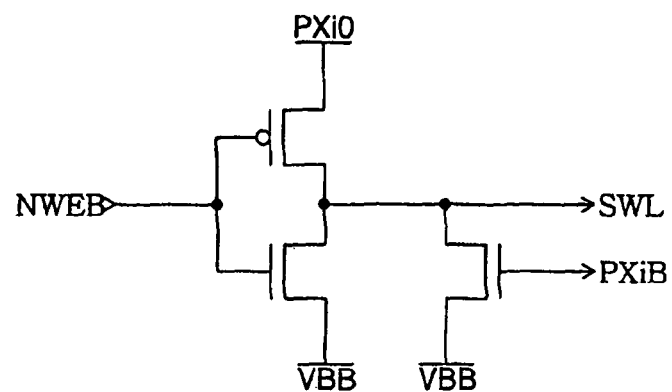
FIG. 10 is a circuit diagram of a word line driver according to embodiment of the present invention.

FIG. 10 is a circuit diagram of a sub-word line driver SWD illustrated in FIG. 6 according to an embodiment of the present invention. As shown, the sub-word line driver SWD includes an inverter (transistors P6 and N15) which is driven by the control signal PXiB and which inverts the control signal NWEB (FIG. 6) to output an inverted signal on a sub-word line SWL, and an NMOS transistor (N16) connected between the sub-word line SWL and a reference voltage VSS (ground).

In the embodiment of FIG. 10, the inverter may be configured of series connected and commonly gated NMOS and PMOS vertical channel transistors which are structured like the NMOS2 and PMOS1 vertical channel transistors illustrated in FIG. 5A. Likewise, the NMOS transistor N16 connected between the sub-word line SWL and a reference voltage VSS may be configured like the NMOS2 vertical channel transistor illustrated in FIG. 5A. As such, the NMOS vertical channel transistors (having p+ type poly-silicon gates) have a positive threshold voltage Vth.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor memory device comprising:
a substrate including a memory core area and a peripheral circuit area; and
a first NMOS vertical channel transistor, a second NMOS vertical channel transistor, and a PMOS vertical channel transistor located in the memory core area of the substrate;
wherein the first NMOS vertical channel transistors includes a p+ poly-silicon gate electrode surrounding a vertical p-channel region, the second NMOS vertical channel transistor includes an n+ poly-silicon gate electrode surrounding a vertical p-channel region, and the PMOS vertical channel transistor includes an n+ poly-silicon gate electrode surrounding a vertical n-channel region, wherein a threshold voltage of the first NMOS vertical channel transistor is positive, and threshold voltages of the second NMOS vertical channel transistor and the PMOS vertical channel transistor are negative, and wherein the first NMOS and PMOS vertical channel transistors are operable in a CMOS operational mode.

2. The semiconductor memory device of claim 1, wherein the memory core area of the substrate includes a memory cell region and a control circuit region for accessing the memory cell region, and
wherein the first NMOS vertical channel transistor is located in the control circuit region, and the second NMOS vertical channel transistor is located in the memory cell region.

3. The semiconductor memory device of claim 2, wherein the second NMOS vertical transistor is a select transistor of a memory cell contained in the memory cell region.

4. The semiconductor memory device of claim 1, further comprising a plurality of NMOS planar channel transistors and a plurality of PMOS planar channel transistors located in the peripheral circuit area of the substrate.

5. The semiconductor memory device of claim 4, wherein the NMOS and PMOS planar channel transistors are coplanar with the NMOS and PMOS vertical channel transistors.

6. The semiconductor memory device of claim 4, wherein the NMOS and PMOS planar channel transistors are located on an elevated plane relative to the NMOS and PMOS vertical channel transistors.

7. The semiconductor memory device of claim 1, further comprising a plurality of NMOS vertical channel transistors and a plurality of PMOS vertical channel transistors located in the peripheral circuit area of the substrate.

8. The semiconductor memory device of claim 7, wherein each of the plurality of NMOS vertical channel transistors of the peripheral circuit area includes a p+ poly-silicon gate electrode surrounding a vertical p-channel region,
wherein the plurality of NMOS vertical channel transistors of the peripheral circuit area include a p+ poly-silicon gate electrode surrounding a vertical p-channel region, and the plurality of PMOS vertical channel transistors of the peripheral circuit area include an n+ poly-silicon gate electrode surrounding a vertical n-channel region, wherein threshold voltages of the plurality of NMOS vertical channel transistors of the peripheral circuit area are positive, and threshold voltages of the plurality of PMOS vertical channel transistors of the peripheral circuit area are negative, and wherein the plurality of NMOS and PMOS vertical channel transistors of the peripheral circuit area are operable in a CMOS operational mode.

9. A semiconductor memory device comprising:
a plurality of memory cells connected between a bit line and a respective plurality of word lines, each of the plurality of memory cells including an NMOS vertical channel select transistor, wherein each of the plurality of NMOS vertical channel select transistors includes an n+ poly-silicon gate electrode surrounding a vertical p-channel region; and
a sense amplifier connected to the bit line including a plurality of NMOS vertical channel transistors and a plurality of PMOS vertical channel transistors, wherein each of the plurality of NMOS vertical channel transistors includes a p+ poly-silicon gate electrode surrounding a vertical p-channel region, and each of the plurality of PMOS vertical channel transistors includes a n+ poly-silicon gate electrode surrounding a vertical n-channel region, wherein a threshold voltage of the NMOS vertical channel transistor is positive, and threshold voltages of each of the plurality of NMOS vertical channel select transistors and the PMOS vertical transistors are negative.

10. The semiconductor memory device of claim 9, further comprising a complementary bit line connected to the sense amplifier, and a plurality of complementary memory cells connected to the complementary bit line.

11. The semiconductor memory device of claim 10, wherein the memory cells and the complementary memory cells are located on a same side of the sense amplifier.

12. The semiconductor memory device of claim 10, wherein the memory cells and the complementary memory cells are located on a opposite sides of the sense amplifier.

13. A semiconductor memory device comprising a memory core operatively coupled to a column decoder and a row decoder on a semiconductor substrate, said memory core comprising:
a plurality of memory cell arrays arranged in rows and columns;
a plurality of word line drivers located in columns between respectively adjacent memory cell arrays; and
a plurality of sense amplifiers located in rows between respectively adjacent memory cell arrays;
wherein each of the memory cell arrays includes a plurality of memory cells, each of the memory cells including an NMOS vertical channel select transistor which has a negative threshold voltage and which includes an n+ poly-silicon gate electrode surrounding a vertical p-channel region;
wherein each of the word line drivers and sense amplifiers include a plurality of PMOS vertical channel transistors and a plurality of NMOS vertical channel transistors, wherein at least one of the plurality of NMOS vertical channel transistors includes a p+ poly-silicon gate electrode surrounding a vertical p-channel region, and at least one of the plurality of PMOS vertical channel transistors includes a n+ poly-silicon gate electrode surrounding a vertical re-channel region, wherein a threshold voltage of the NMOS vertical channel transistor is positive, and a threshold voltage of the PMOS vertical transistor is negative.

14. The semiconductor memory device of claim 13, wherein the row decoder and column decoder comprise a plurality of NMOS planar channel transistors and a plurality of PMOS planar channel transistors.

15. The semiconductor memory device of claim 13, wherein the row decoder and column decoder comprise a plurality of NMOS vertical channel transistors and a plurality of PMOS vertical channel transistors,
wherein the plurality of NMOS vertical channel transistors of the row decoder and column decoder include a p+ poly-silicon gate electrode surrounding a vertical p-channel region, and the plurality of PMOS vertical channel transistors of the row decoder and column decoder include an n+ poly-silicon gate electrode surrounding a vertical n-channel region, wherein threshold voltages of the plurality of NMOS vertical channel transistors of the row decoder and column decoder are positive, and threshold voltages of the plurality of PMOS vertical channel transistors of the row decoder and column decoder are negative, and wherein the plurality of NMOS and PMOS vertical channel transistors of the row decoder and column decoder are operable in a CMOS operational mode.

* * * * *